US 11,449,125 B1

(12) United States Patent
Verrilli et al.

(10) Patent No.: US 11,449,125 B1
(45) Date of Patent: Sep. 20, 2022

(54) ADAPTIVE DYNAMIC CLOCK AND VOLTAGE SCALING

(71) Applicant: QUALCOMM INCORPORATED, San Diego, CA (US)

(72) Inventors: Colin Beaton Verrilli, Apex, NC (US); Matthew Severson, Austin, TX (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 17/220,603

(22) Filed: Apr. 1, 2021

(51) Int. Cl.
| | | |
|---|---|---|
| *G06F 1/00* | (2006.01) | |
| *G06F 1/3287* | (2019.01) | |
| *G01R 21/133* | (2006.01) | |
| *G06F 1/3296* | (2019.01) | |
| *G06F 1/324* | (2019.01) | |

(52) U.S. Cl.
CPC ......... *G06F 1/3287* (2013.01); *G01R 21/133* (2013.01); *G06F 1/324* (2013.01); *G06F 1/3296* (2013.01)

(58) Field of Classification Search
CPC ...... G06F 1/324; G06F 1/3296; G06F 1/3287; G01R 21/133
See application file for complete search history.

(56) References Cited

U.S. PATENT DOCUMENTS

| | | | |
|---|---|---|---|
| 2013/0188436 A1* | 7/2013 | Thyagarajan | G11C 5/148 365/227 |
| 2017/0344102 A1* | 11/2017 | Kolla | G06F 1/3296 |
| 2022/0012108 A1* | 1/2022 | Ajmera | G06F 9/542 |

* cited by examiner

*Primary Examiner* — Nitin C Patel
(74) *Attorney, Agent, or Firm* — Smith Tempel Blaha LLC/Qualcomm

(57) ABSTRACT

In each of two or more pipelined subsystems, the relative amount of time that the processing cores are idle may be determined. If the idle ratio is below a threshold, the clock frequency and voltage may be adjusted using dynamic clock and voltage scaling (DCVS) based on a power limit. However, if the idle ratio exceeds the threshold, the clock frequency and voltage may be decreased without regard to the power limit.

30 Claims, 6 Drawing Sheets

ADAPTIVE DYNAMIC CLOCK AND VOLTAGE SCALING

DESCRIPTION OF THE RELATED ART

Mobile or portable computing devices ("PCD"s) commonly include mobile phones, laptop, palmtop and tablet computers, portable digital assistants ("PDA"s), portable game consoles, and other portable electronic devices. PCDs commonly contain integrated circuits or systems-on-a-chip ("SoC"s) that include numerous components or subsystems designed to work together to deliver functionality to a user. For example, an SoC may contain any number of processing engines, such as central processing units ("CPU"s), graphical processing units ("GPU"s), digital signal processors ("DSP"s), neural processing units ("NPU"s), wireless transceiver units (also referred to as modems), etc.

As a PCD is powered by a battery, power management is an important consideration. "Power management" refers to techniques used to balance power consumption and performance in a PCD, as well as to manage the generation of thermal energy (i.e., heat). Dynamic clock and voltage scaling ("DCVS") is a technique by which the frequency and voltage at which a processor is operated are adjusted dynamically, i.e., in real time in response to changes in operating conditions, to deliver a desired balance or tradeoff between power consumption and performance level. When lower power consumption is of higher priority than higher performance, the clock frequency and voltage may be decreased, and when higher performance is of higher priority than lower power consumption, the clock frequency and voltage may be increased.

A system may comprise pipelined subsystems, in which the output of one subsystem serves as the input to another subsystem. A potential problem with pipelined subsystems, commonly referred to as a bottleneck, may occur if one subsystem processes data substantially faster than the other subsystem. Applying DCVS to pipelined subsystems may present various challenges.

SUMMARY OF THE DISCLOSURE

Systems, methods, computer-readable media, and other examples are disclosed for adaptive power control. Aspects of the adaptive power control may include adaptive DCVS in pipelined subsystems.

An exemplary method for adaptive power control may include determining an idle frequency of a processing subsystem, which may have one or more processing cores. The exemplary method may also include comparing the idle frequency with a threshold. The exemplary method may further include reducing at least one of a clock frequency and a voltage supplied to the first processing subsystem if the idle frequency is not less than the threshold.

An exemplary system for adaptive power control may include an idle monitor system, a limits management controller, and a DCVS management controller, all associated with a processing subsystem, which may have one or more processing cores. The limits management controller may be configured to determine an idle frequency of the processing subsystem using information provided by the idle monitor system. The limits management controller may also be configured to compare the idle frequency with a threshold. The first DCVS management controller may be configured to reduce at least one of a clock frequency and a voltage supplied to the processing subsystem if the idle frequency is not less than the threshold.

Another exemplary system for adaptive power control may include means for determining an idle frequency of a processing subsystem, which may have one or more processing cores. The exemplary system may also include means for comparing the idle frequency with a threshold. The exemplary system may further include means for reducing at least one of a clock frequency and a voltage supplied to the processing subsystem if the idle frequency is not less than the threshold.

An exemplary system for adaptive power control in a multi-die package may include a first idle monitor system, a first limits management controller, and a first DCVS management controller, all included in a first die associated with a first processing subsystem. The exemplary system may also include a second idle monitor system, a second limits management controller, and a second DCVS management controller, all included in a second die associated with a second processing system. The first and second processing systems may be coupled in a pipelined arrangement. The first processing system and second processing system each may include one or more processing cores. The first limits management controller may be configured to determine a first idle frequency of the first processing subsystem using information provided by the first idle monitor system. The first limits management controller may also be configured to compare the first idle frequency with a threshold. The first DCVS management controller may be configured to reduce at least one of a clock frequency and a voltage supplied to the first processing subsystem if the first idle frequency is not less than the threshold. Similarly, the second limits management controller may be configured to determine a second idle frequency of the second processing subsystem using information provided by the second idle monitor system. The second limits management controller may also be configured to compare the second idle frequency with the threshold. The second DCVS management controller may be configured to reduce at least one of a clock frequency and a voltage supplied to the second processing subsystem if the second idle frequency is not less than the threshold.

BRIEF DESCRIPTION OF THE DRAWINGS

In the Figures, like reference numerals refer to like parts throughout the various views unless otherwise indicated. For reference numerals with letter character designations such as "102A" or "102B", the letter character designations may differentiate two like parts or elements present in the same Figure. Letter character designations for reference numerals may be omitted when it is intended that a reference numeral to encompass all parts having the same reference numeral in all Figures.

DETAILED DESCRIPTION

The word "exemplary" is used herein to mean "serving as an example, instance, or illustration." The word "illustrative" may be used herein synonymously with "exemplary." Any aspect described herein as "exemplary" is not necessarily to be construed as preferred or advantageous over other aspects.

Figure 1:
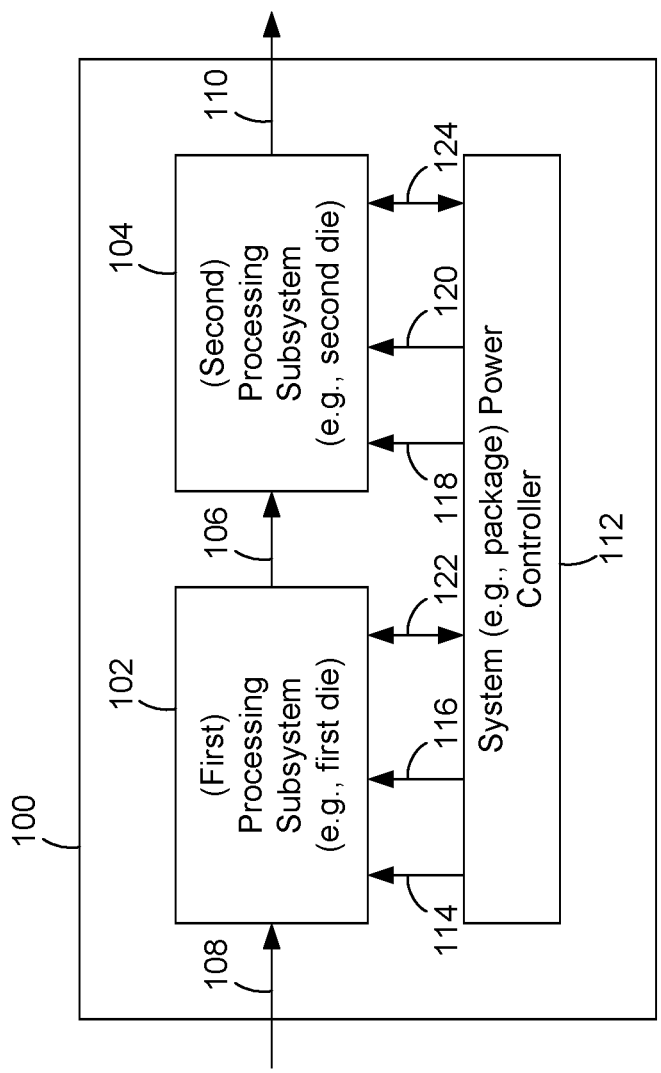
FIG. 1 is a block diagram illustrating a system having pipelined subsystems configured for adaptive DCVS, in accordance with exemplary embodiments.

As illustrated in FIG. 1, a system 100 configured for adaptive power control may include a first processing subsystem 102 and a second processing subsystem 104. The first and second processing subsystems 102 and 104 may be coupled in a pipelined arrangement. That is, a data path 106 couples an output of the first processing subsystem 102 to an input of the second processing subsystem 104. The first processing subsystem 102 may receive input data via an input data path 108 and process that input data. The data resulting from that processing by the first processing subsystem 102 is provided via the data path 106 to the second processing subsystem 104, which processes that data. The data resulting from that processing by the second processing subsystem 104 is provided via a data path 110 and forms the output of the system 100.

The first and second processing subsystems 102 and 104 may be of any type, such as, for example, neural network processors. The first processing subsystem 102 may be a first stage or partition of a neural network, and the second processing subsystem 104 may be a second stage or partition of the neural network. The system 100 may be, for example, a machine-learning accelerator device, such as a multi-die package. The first and second processing subsystem 102 and 104 may be first and second dies (i.e., semiconductor chips), respectively, of such a multi-die package. In this exemplary embodiment, the data path 106 is thus an inter-die connection or link.

A system power controller 112 may provide a power input (e.g., a voltage rail) 114 and a clock signal input 116 to the first processing subsystem 102. Similarly, the system power controller 112 may provide a power input 118 and a clock signal input 120 to the second processing subsystem 104. Although in this exemplary embodiment the system power controller 112 is included in the system 100, in other embodiments (not shown) such a system power controller may be external to such a system. For example, the system 100 may be a system-on-a-chip ("Sort") coupled to a system power controller chip. Also, in other embodiments the various power inputs and clock signal inputs may be provided by separate controllers rather than the same "system" power controller.

The system power controller 112 and the first processing subsystem 102 may be configured to communicate with each other via a bidirectional first communication path 122. Similarly, the system power controller 112 and the second processing subsystem 104 may be configured to communicate with each other via a bidirectional second communication path 124. As described below, communications between the system power controller 112 and the first and second processing subsystems 102 and 104 may relate to adjusting the voltages that the system power controller 112 provides to the first and second processing subsystems 102 and 104 via the respective power inputs 114 and 118, and adjusting the frequencies of the clock signals that the system power controller 112 provides to the first and second processing subsystems 102 and 104 via the respective clock signal inputs 116 and 120. For example, the first processing system 102 may send a request to the system power controller 112 via the first communication path 122 to adjust the clock frequency and voltage supplied to the first processing subsystem 102 via the power input 114 and a clock signal input 116, respectively. Similarly, the second processing system 104 may send a request to the system power controller 112 via the second communication path 124 to adjust the clock frequency and voltage supplied to the second processing subsystem 104 via the power input 118 and clock signal input 120, respectively.

The system 100 may produce better results when the first and second processing subsystems 102 and 104 are balanced in terms of various characteristics, such as processing speed (i.e., information per unit time from input to output), power consumption, etc., than when the first and second processing subsystems 102 and 104 are unbalanced in such respects. In addition to imbalances due to the processing configurations of the first and second processing subsystems 102 and 104, there may be inherent imbalances, such as semiconductor process variations (e.g., minimum voltages, leakage currents, etc.). If one of the first and second processing subsystems 102 and 104 were to perform its processing at a substantially slower rate than the other, consume substantially more power than the other, etc., performance of the entire system 100 could be adversely impacted. In exemplary embodiments described herein, the first and second processing subsystems 102 and 104 include features that may mitigate this potential problem.

The above-described imbalances in conventional pipelined subsystems present challenges in applying dynamic clock and voltage scaling ("DCVS"). For example, if conventional DCVS were applied to each of two conventional pipelined subsystems independently, such that each subsystem were to have its own power budget (i.e., power threshold), the subsystem that is capable of processing its workload the fastest would tend to request increases in clock frequency and voltage until that subsystem's power consumption reaches that subsystem's power budget. This behavior of the faster subsystem, i.e., driving itself to increasingly higher performance until a power threshold is reached, may adversely impact the performance of the system as a whole because the subsystem that processes its workload more slowly becomes, in effect, a bottleneck. Exemplary embodiments described below include features that may throttle the performance level of whichever of the first and second subsystems 102 and 104 is substantially faster than the other, and apply DCVS based on a total power budget distributed between the first and second subsystems 102 and 104.

Figure 2:
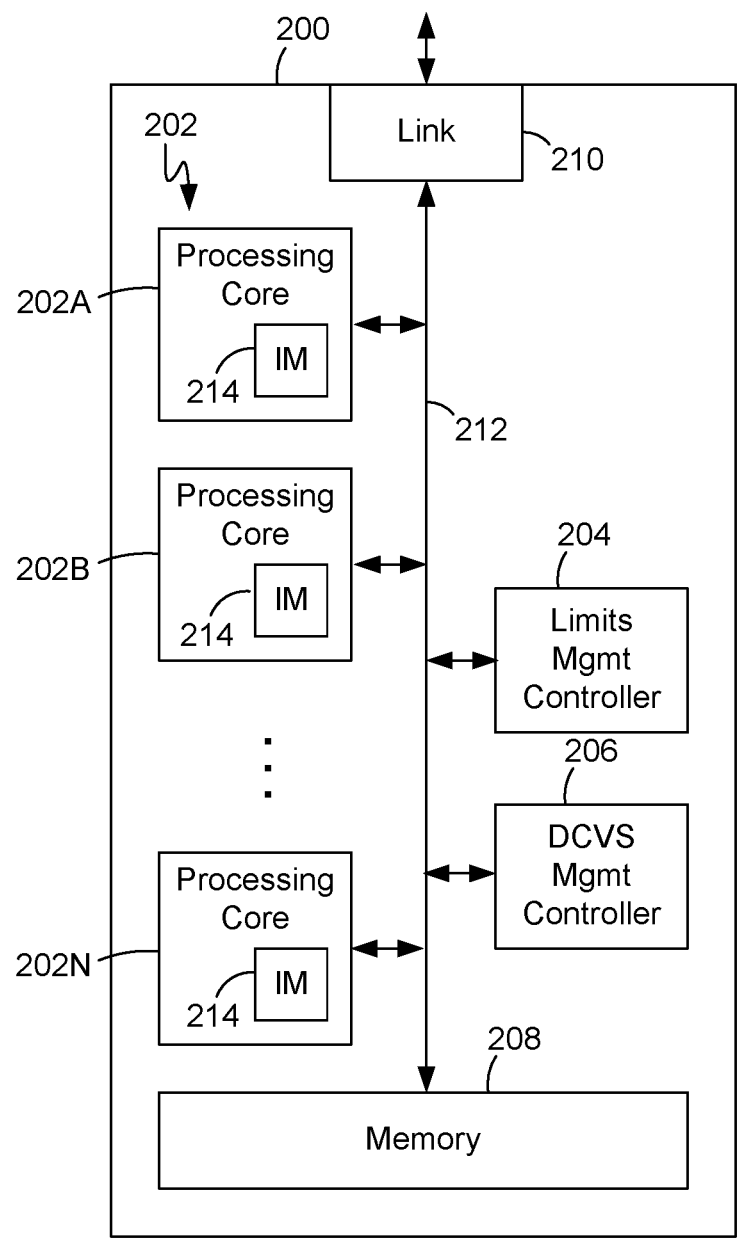
FIG. 2 is a block diagram illustrating a processing subsystem configured for adaptive DCVS, in accordance with exemplary embodiments.

In FIG. 2, a subsystem 200 is illustrated that may be an example of either or both of the above-described first and second subsystems 102 and 104 (FIG. 1). The exemplary subsystem 200 may include two or more processing cores 202, such as processing cores 202A, 202B, etc., through 202N. The subsystem 200 may also include a limits management controller 204 and a DCVS management controller 206. The limits management controller 204 and DCVS management controller 206 each may comprise any type of circuitry, such as, for example, a finite state machine, processor-based circuitry configurable by software or firmware, etc. The subsystem 200 may further include one or more memories 208. The subsystem 200 may be in the form of a die.

The subsystem 200 may include one or more inter-die communication links 210. Although not shown in FIG. 2, the one or more inter-die communication links 210 may be coupled to similar inter-die communication links in another subsystem, thereby providing one or more data paths between the subsystem 200 and the other subsystem in a manner similar to that described above with regard to FIG. 1. A data communication interconnect (e.g., one or more buses or similar data paths) 212 may be configured to enable the processing cores 202, the limits management controller 204, the DCVS management controller 206, the memory 208, and the communication links 210 to communicate with each other.

Each processing core 202 may include or otherwise be associated with an idle monitor 214. Each idle monitor 214 may be configured to determine whether its associated processing core 202 is idle or is not idle. Whether a processing core 202 is idle may be determined by, for example, determining whether the processing core 202 has completed processing a "batch" in an embodiment in which the input data is provided to the processing cores 202 in batches, i.e., discrete amounts of data having a (batch) size known to the idle monitors 214. Alternatively, the processing core 202 may be idle if it is waiting for buffer availability to write its output to the next processing subsystem in the pipeline. A processing core 202 may provide an indication (not shown) that the processing core 202 is in a state in which it is waiting for input data (e.g., a next batch) and/or that the processing core 202 has just completed processing the data (i.e., a previous batch) and/or that the processing core 202 is awaiting buffer availability. Alternatively, whether a processing core 202 is idle may be determined by, for example, counting the number of processing cycles executed by the processing core 202 over a time interval and comparing that number with a threshold. A processing core 202 that executes fewer than the threshold number of processing cycles over the time interval may be deemed idle.

Each idle monitor 214 may be configured to send an indication to the limits management controller 204 indicating whether its associated processing core 202 is idle or is not idle. These indications enable the limits management controller 204 to determine the idle status of each processing core 202. As described in further detail below with regard to the exemplary embodiment, the limits management controller 204 may use the idle status of each processing core 202 to determine an idle frequency that represents the extent to which the processing cores 202 are collectively idle over a time interval. In other words, the idle frequency represents a metric of how idle (or stated conversely, how active) the subsystem 200 is.

Although in the exemplary embodiment illustrated in FIG. 2 each idle monitor 214 is associated with exactly one of the processing cores 202, in other embodiments (not shown) any other type of idle monitor system may be associated in any other way with a processing subsystem comprising one or more processing cores. For example, in other embodiments a centralized idle monitor system could determine the information used by the limits management controller 204 to determine the idle frequency of the one or more processing cores. Also, although in the exemplary embodiment the limits management controller 204 uses indications received from the various idle monitors 214 to determine the idle status of each processing core 202, in other embodiments such a limits management controller may use a different type of information received from an idle monitor system or idle monitors.

The DCVS management controller 206 may be configured to apply DCVS to the processing cores 202. Applying DCVS refers to adjusting the clock frequency, the supply voltage, or both the clock frequency and supply voltage in combination, supplied to the subsystem 200 (and thus to the processing cores 202). In an exemplary embodiment, the DCVS management controller 206 may be configured to apply DCVS by sending a DCVS adjustment request to the system power controller 112 (FIG. 1). In response to the request, the system power controller 112 may, depending upon one or more other measurements, such as the amount of power being drawn, adjust the clock frequency and voltage supplied to the subsystem 200 having the requesting DCVS management controller 206. Note that in the exemplary embodiment the system power controller 112 may respond to requests received from each of the subsystems 102 and 104 (FIG. 1) independently from requests received from the other.

Although in the exemplary embodiment applying DCVS may comprise cooperation (e.g., an exchange of communications) between the DCVS management controller 206 and the system power controller 112 (FIG. 1), in other embodiments (not shown) a DCVS management controller may apply DCVS directly to the one or more processing cores. For example, a DCVS management controller may apply DCVS directly by switching the processing cores 202 from being operated by a system clock signal to being supplied by a frequency-divided clock signal derived from the system clock signal using a clock frequency divider in the subsystem.

Figure 3:
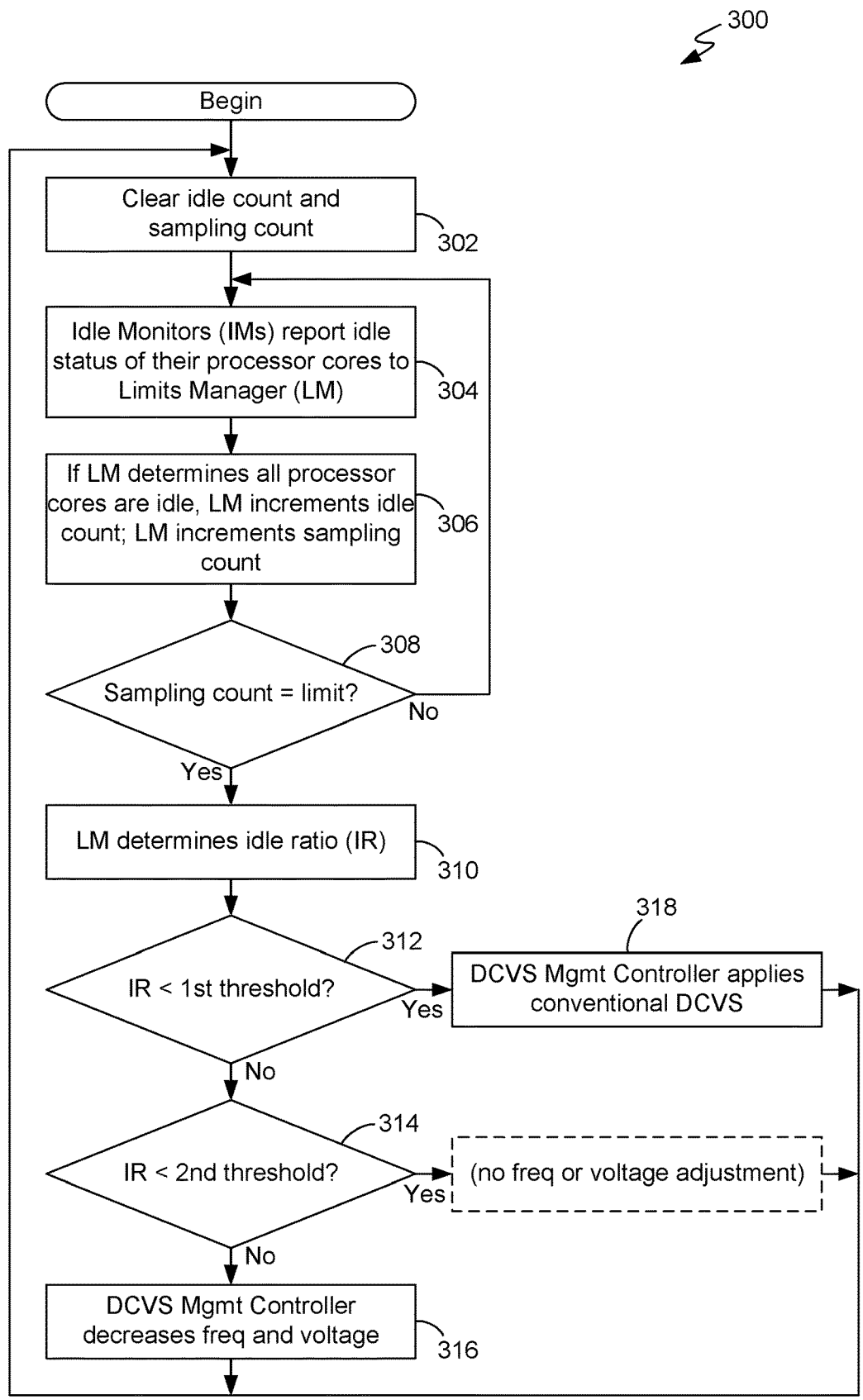
FIG. 3 is a flow diagram illustrating a method for adaptive DCVS, in accordance with exemplary embodiments.

In FIG. 3, a method 300 for adaptive power control using adaptive DCVS is illustrated in flow diagram form. The method 300 may be controlled by, for example, the above-described limits management controller 204 and DCVS management controller 206 (FIG. 2) as configured by software or firmware. As indicated by block 302, the limits management controller 204 may clear (i.e., initialize to zero) an idle count and a sampling count. As indicated by block 304, the limits management controller 204 may receive indications of the idle status of each of the one or more processing cores 202 (FIG. 2) from their associated idle monitors 214. Based on this information from the idle monitors 214, the limits management controller 204 may then determine whether all processing cores 202 are idle, as indicated by block 306. The limits management controller 204 may increment the sampling count each time the determination indicated by block 306 is made. If all of the processing cores 202 are simultaneously idle, the limits management controller 204 may increment the above-referenced idle count.

As indicated by block 308, the limits management controller 204 may determine whether the sampling count has reached a limit or threshold. If the sampling count has not reached this sampling count threshold, then the method 300 may return to the above-described block 304, and repeat the actions described above with regard to blocks 304-306 in an iterative or looping manner until the sampling count reaches the sampling count threshold.

When it has been determined (block 308) that the sampling count has reached the sampling count threshold, the limits management controller 204 may determine an idle ratio, as indicated by block 310. In this exemplary embodiment, the idle ratio may be determined by dividing the idle count by the sampling count. The idle ratio used in the method 300 is an example of an idle frequency or metric of subsystem idleness. In other embodiments, an idle frequency may be determined in other ways.

The limits management controller 204 may compare the idle ratio with one or more thresholds to determine whether to apply DCVS or to decrease the clock frequency and voltage (i.e., throttle the subsystem) independently of such DCVS. For example, as indicated by block 312, the limits management controller 204 may determine whether the idle ratio is less than a first threshold. If it is determined that the idle ratio is not less than the first threshold, then the limits management controller 204 may determine whether the idle ratio is less than a second threshold, as indicated by block 314. If it is determined that the idle ratio is not less than either the first threshold or the second threshold, then the limits management controller 204 may send a request to the DCVS management controller 206 to decrease the clock frequency and voltage, as indicated by block 316.

The idle ratio exceeding both the first and second thresholds indicates that the subsystem 200 is very frequently idle. The subsystem 200 may be very frequently idle because the subsystem 200 is frequently completing its processing before another subsystem in the pipelined system (as described above with regard to FIG. 1) completes its processing. In frequently completing its processing before another subsystem in the pipelined system completes its processing, the subsystem 200 may also be consuming substantially more power than the other subsystem. Reducing the clock frequency and voltage supplied to the subsystem 200 when it has been determined that the subsystem 200 is very frequently idle may throttle (i.e., slow down) the subsystem 200 and thus improve performance of the system as a whole.

However, if it is determined (block 312) that the idle ratio is less than the first threshold, then the limits management controller 204 may apply DCVS, as indicated by block 318. The DCVS may be applied in accordance with block 318. For example, the limits management controller 204 may send a request to the DCVS management controller 206 to apply DCVS. The DCVS management controller 206 may, in response to the request from the limits management controller 204, send a request to the system power controller 112 (FIG. 1) to apply DCVS.

Figure 4:
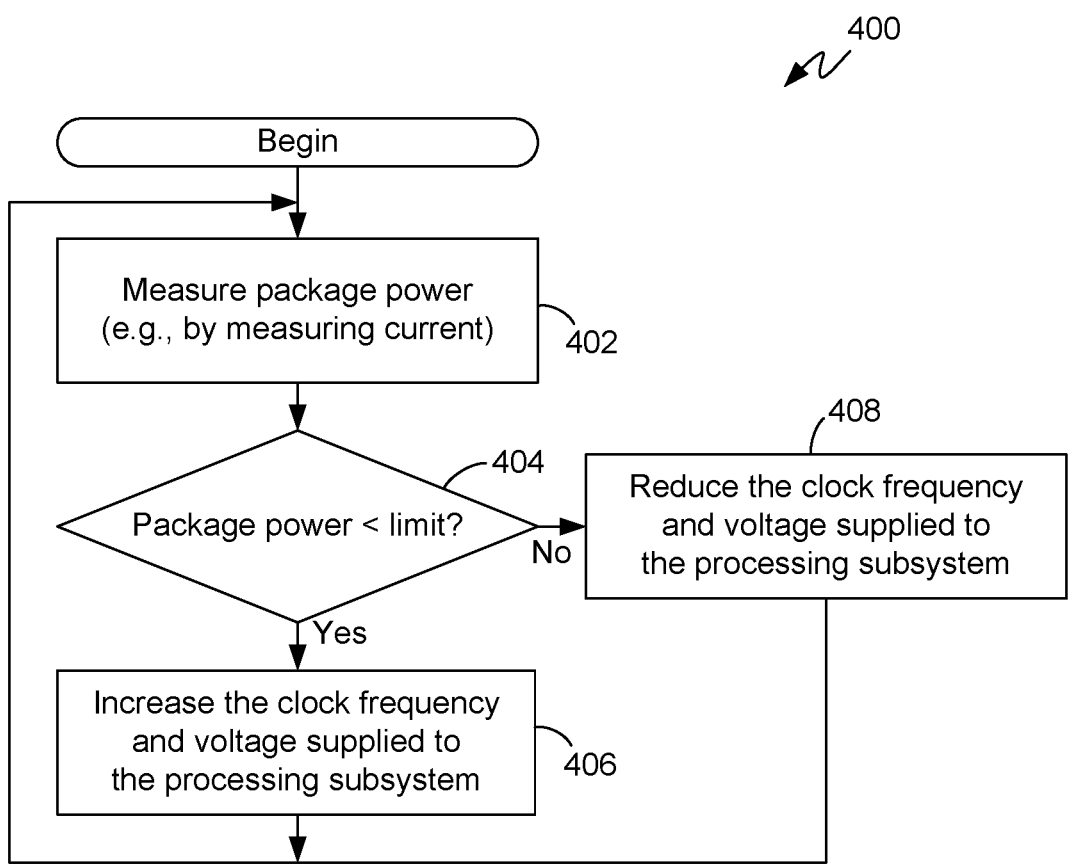
FIG. 4 is a flow diagram illustrating a method for DCVS.

In FIG. 4, a method 400 for applying DCVS is illustrated in flow diagram form. The method 400 may be an example of applying DCVS in accordance with above-described block 318 (FIG. 3). The method 400 may be controlled by, for example, the above-described system power controller 112, as configured by software or firmware. As indicated by block 402, and referring briefly again to FIG. 1, the system power controller 112 may measure the total package power, i.e., the amount of power drawn by the system 100 as a whole as a result of the operation of all processing subsystems 102, 104, etc. Total package power may be measured in various ways. For example, the system power controller 112 may measure the total current drawn on the voltage rails (i.e., the power inputs 114 and 118) supplying the subsystems 102 and 104. The total current is related to the total package power.

As indicated by block 404, the system power controller 112 may compare the measured total package power with a package power limit or threshold. If it is determined (block 404) that the total package power is less than the package power threshold, then the system power controller 112 may increase the clock frequency and voltage that the system power controller 112 supplies to the subsystem that requested DCVS, as indicated by block 406. However, if it is determined (block 402) that the total package power is not less than the package power threshold, then the system power controller 112 may decrease the clock frequency and voltage that the system power controller 112 supplies to the subsystem that requested DCVS, as indicated by block 408.

The method 400 is intended only as a straightforward example of a DCVS method or algorithm in which the determination of how to adjust the clock frequency and voltage is based on a comparison between measured power and a power threshold. It should be understood that a reference to DCVS or applying DCVS herein means that clock frequency and/or voltage are adjusted based on a comparison involving measured power, such as a comparison between measured power and one or more power thresholds. In contrast, note that the request to decrease clock frequency and voltage described above with regard to block 316 (FIG. 3) is made without regard to (i.e., independently of) any comparison involving measured power, which is generally characteristic of DCVS algorithms. Rather, the request to decrease clock frequency and voltage described above with regard to block 316 is based only on the extent of the collective idleness of the processing cores 202.

It may be noted that if DCVS (e.g., in accordance with the method 400) were invoked at the requests of the pipelined subsystems without being conditioned upon the determinations in one or both of blocks 312 and 314 of the method 300 (FIG. 3), then the DCVS could potentially increase the clock frequency and voltage applied to the faster subsystem until the power consumed by the faster subsystem reached the package power threshold. However, conditioning the application of DCVS upon the idle ratio being less than the first threshold, i.e., the subsystem being very infrequently idle, may help avoid this potential problem.

Referring again to FIG. 3, if it is determined (blocks 312 and 314, respectively) that the idle ratio is not less than the first threshold but is less than the second threshold, then the limits management controller 204 may refrain from any action in response to those determinations. That is, in this exemplary embodiment the limits management controller 204 neither requests DCVS (i.e., that clock frequency and voltage be adjusted based on a comparison between measured power and a threshold) nor requests any other adjustment of clock frequency and/or voltage. The idle ratio being between the first and second thresholds indicates that the subsystem 200 is neither very frequently idle nor very infrequently idle relative to the other subsystem or subsystems with which the subsystem 200 is pipelined, but rather is idle substantially as frequently as the other subsystem (i.e., equally frequently, slightly more frequently, or slightly less frequently). In this exemplary embodiment, when the idle ratio is between the first and second thresholds, the clock frequency and voltage being supplied to the subsystem 200 need not be adjusted because none of the pipelined subsystems are impeding performance of the system as a whole.

Figure 5:
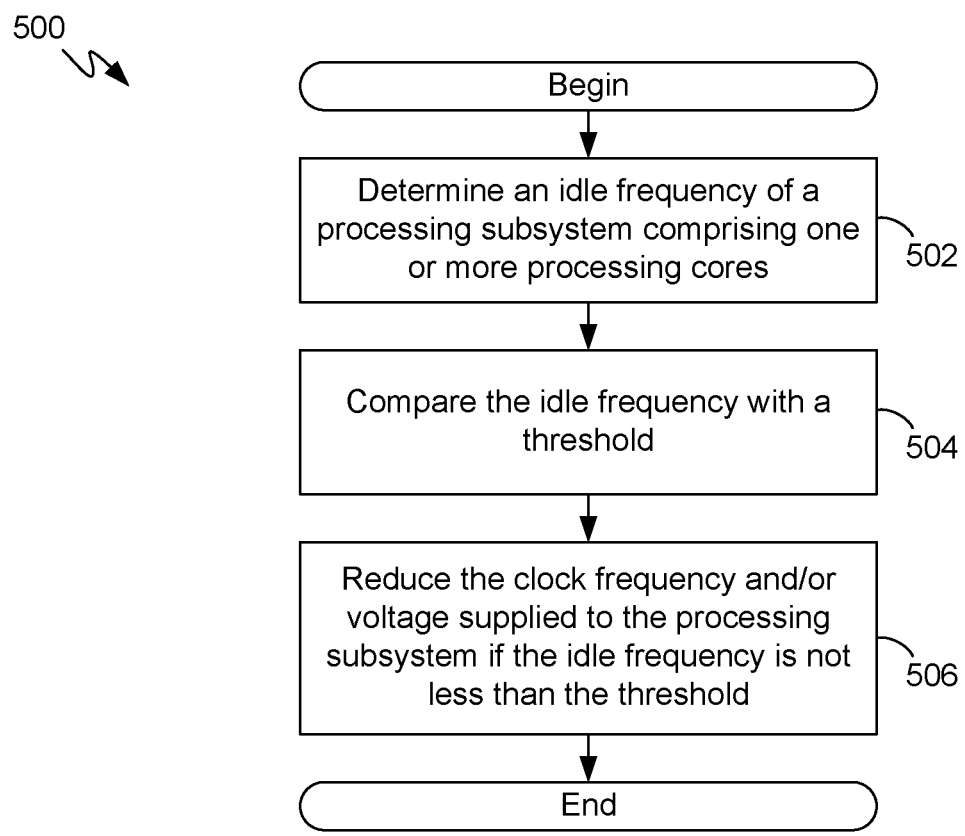
FIG. 5 is a flow diagram illustrating another method for adaptive DCVS, in accordance with exemplary embodiments.

In FIG. 5, a method 500 for adaptive power control is illustrated in flow diagram form. As indicated by block 502, an idle frequency of a processing subsystem comprising one or more processing cores may be determined. As indicated by block 504, the idle frequency may be compared with one or more thresholds. As indicated by block 506, the clock frequency and/or voltage supplied to the subsystem may be reduced if it is determined that the idle frequency of the processing subsystem is not less than a threshold. The above-described method 300 (FIG. 3), which uses two thresholds, may be an example of the method 500.

In some embodiments, the method 500 may be applied to each of two or more pipelined subsystems. Also, in some embodiments the comparison or comparisons with one or more thresholds may determine whether DCVS is applied. In each subsystem, the relative amount of time that the processing cores are idle may be determined. If the idle ratio is below a threshold, the clock frequency and voltage may be adjusted using DCVS, i.e., based on a power limit. However, if the idle ratio exceeds the threshold, the clock frequency and voltage may be decreased without regard to the power limit.

Figure 6:
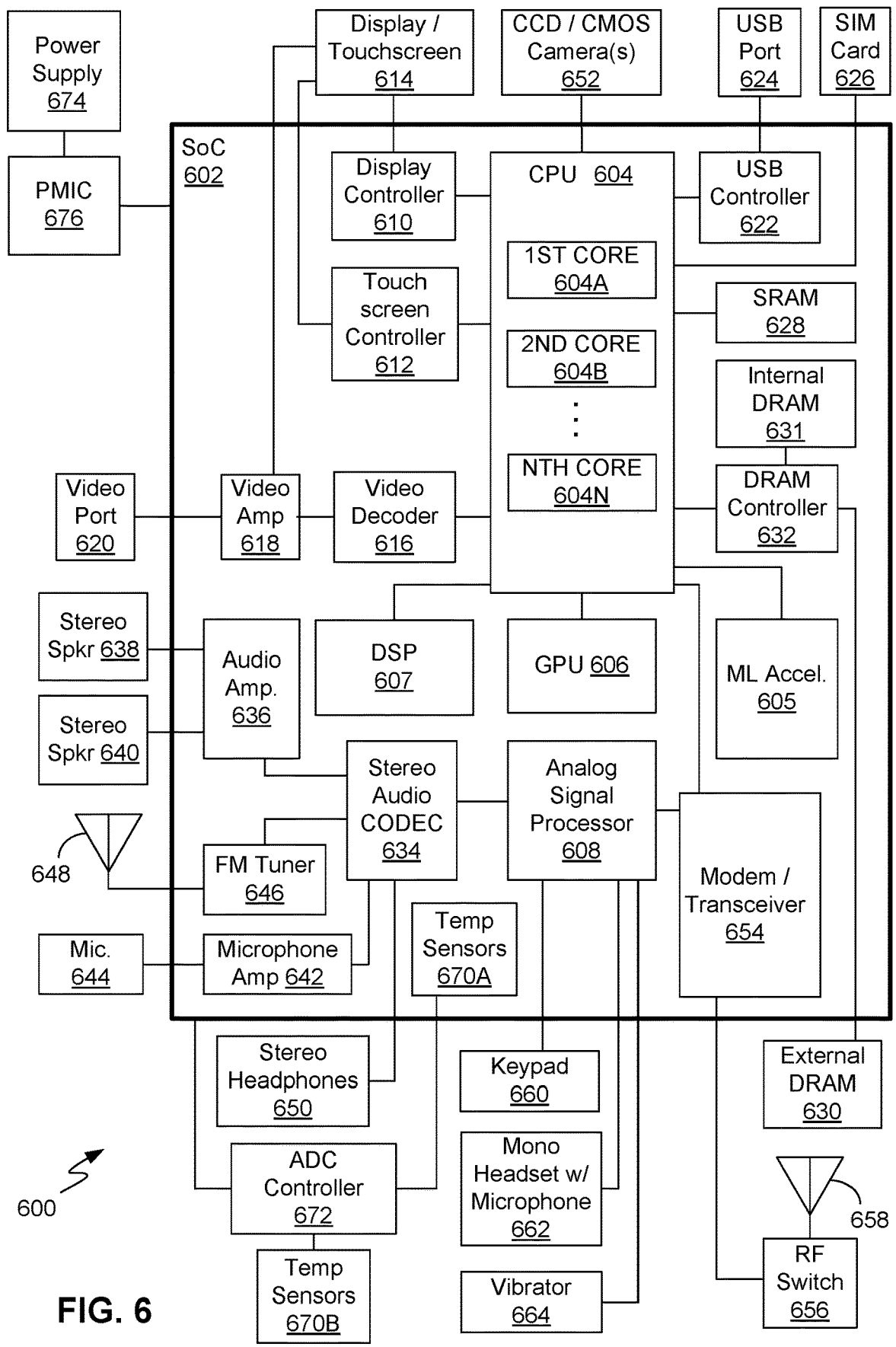
FIG. 6 is a block diagram of a PCD, in accordance with exemplary embodiments.

In FIG. 6, an example of a PCD 600 in which exemplary embodiments of systems, methods, computer-readable media, and other examples of adaptive power control may be provided is illustrated. For purposes of clarity, some data buses, clock signals, power supply voltages, etc., are not shown in FIG. 6.

The PCD 600 may include an SoC 602. The SoC 602 may include a CPU 604, a GPU 606, a DSP 607, an analog signal processor 608, or other processors. The CPU 604 may include one or more CPU cores, such as a first CPU core 604A, a second CPU core 604B, etc., through an Nth CPU core 604N. The PCD 600 may also include a machine learning ("ML") accelerator 605, which may be a multi-die package. The ML accelerator 605 may be an example of the system 100 described above with regard to FIG. 1.

A display controller 610 and a touch-screen controller 612 may be coupled to the CPU 604. A touchscreen display 614 external to the SoC 602 may be coupled to the display controller 610 and the touch-screen controller 612. The PCD 600 may further include a video decoder 616 coupled to the CPU 604. A video amplifier 618 may be coupled to the video decoder 616 and the touchscreen display 614. A video port 620 may be coupled to the video amplifier 618. A universal serial bus ("USB") controller 622 may also be coupled to CPU 604, and a USB port 624 may be coupled to the USB controller 622. A subscriber identity module ("SIM") card 626 may also be coupled to the CPU 604.

One or more memories may be coupled to the CPU 604. The one or more memories may include both volatile and non-volatile memories. Examples of volatile memories include static random access memory ("SRAM") 628 and dynamic RAMs ("DRAM"s) 630 and 631. Such memories may be external to the SoC 602, such as the DRAM 630, or internal to the SoC 602, such as the DRAM 631. A DRAM controller 632 coupled to the CPU 604 may control the writing of data to, and reading of data from, the DRAMs 630 and 631. In other embodiments, such a DRAM controller may be included within a processor, such as the CPU 604.

A stereo audio CODEC 634 may be coupled to the analog signal processor 608. Further, an audio amplifier 636 may be coupled to the stereo audio CODEC 634. First and second stereo speakers 638 and 640, respectively, may be coupled to the audio amplifier 636. In addition, a microphone amplifier 642 may be coupled to the stereo audio CODEC 634, and a microphone 644 may be coupled to the microphone amplifier 642. A frequency modulation ("FM") radio tuner 646 may be coupled to the stereo audio CODEC 634. An FM antenna 648 may be coupled to the FM radio tuner 646. Further, stereo headphones 650 may be coupled to the stereo audio CODEC 634. Other devices that may be coupled to the CPU 604 include one or more digital (e.g., CCD or CMOS) cameras 652.

A modem or RF transceiver 654 may be coupled to the analog signal processor 608 and the CPU 604. An RF switch 656 may be coupled to the RF transceiver 654 and an RF antenna 658. In addition, a keypad 660, a mono headset with a microphone 662, and a vibrator device 664 may be coupled to the analog signal processor 608.

The SoC 602 may have one or more internal or on-chip thermal sensors 670A and may be coupled to one or more external or off-chip thermal sensors 670B. An analog-to-digital converter ("ADC") controller 672 may convert voltage drops produced by the thermal sensors 670A and 670B to digital signals. A power supply 674 and a PMIC 676 may supply power to the SoC 602.

The PCD 600 is only one example of a device or system in which exemplary embodiments of systems, methods, computer-readable media, and other embodiments of adaptive power control may be provided. Other examples may include other types of computing devices or computing systems, such as those used in datacenters.

Firmware or software may be stored in any of the above-described memories, such as DRAM 630 or 631, SRAM 628, etc., or may be stored in a local memory directly accessible by the processor hardware on which the software or firmware executes. Execution of such firmware or software may control aspects of any of the above-described methods or configure aspects any of the above-described systems. Any such memory or other non-transitory storage medium having firmware or software stored therein in computer-readable form for execution by processor hardware may be an example of a "computer-readable medium," as the term is understood in the patent lexicon.

Alternative embodiments will become apparent to one of ordinary skill in the art to which the invention pertains. Therefore, although selected aspects have been illustrated and described in detail, it will be understood that various substitutions and alterations may be made therein.

Implementation examples are described in the following numbered clauses:

1. A method for adaptive power control, comprising:
  determining a first idle frequency of a first processing subsystem comprising one or more processing cores;
  comparing the first idle frequency with a first threshold; and
  reducing at least one of a clock frequency and a voltage supplied to the first processing subsystem if the first idle frequency is not less than the first threshold.

2. The method of clause 1, wherein determining the first idle frequency comprises:
  determining an idle status of each of a plurality of processing cores of the first subsystem; and
  determining the first idle frequency based on the idle status of each of the processing cores.

3. The method of clause 2, wherein determining the first idle frequency further comprises:
  determining whether all processing cores of the first subsystem are simultaneously idle;
  incrementing an idle count if all processing cores of the first subsystem are simultaneously idle; and
  repeating the determining of whether all processing cores of the first subsystem are simultaneously idle and the incrementing of the idle count a plurality of sampling times;
  wherein determining the first idle frequency comprises determining a ratio of the idle count to the sampling times.

4. The method of clause 1, further comprising applying dynamic clock and voltage scaling (DCVS) based on power if the first idle frequency is less than the first threshold.

5. The method of clause 1, further comprising:
  comparing the first idle frequency with a second threshold if the first idle frequency is not less than the first threshold, wherein the second threshold represents a greater idle frequency than the first threshold;
  wherein reducing at least one of the clock frequency and the voltage supplied to the first processing subsystem comprises reducing at least one of the clock frequency and the voltage supplied to the first processing subsystem if the first idle frequency is not less than the first threshold and the first idle frequency is not less than the second threshold.

6. The method of clause 4, wherein applying DCVS comprises:
  determining a power measurement associated with the first processing subsystem; and increasing at least one of the clock frequency and the voltage supplied to the first processing system if the power measurement is less than a power threshold.

7. The method of clause 1, further comprising:
determining a second idle frequency of a second processing subsystem coupled in a pipelined arrangement with the first processing subsystem;
comparing the second idle frequency with the first threshold; and
reducing at least one of a clock frequency and a voltage supplied to the second processing subsystem if the second idle frequency is not less than the first threshold.

8. A system for adaptive power control, comprising:
a first idle monitor system associated with a first processing subsystem comprising one or more processing cores;
a first limits management controller associated with the first processing subsystem, the first limits management controller configured to:
determine a first idle frequency of the first processing subsystem using information provided by the first idle monitor system; and
compare the first idle frequency with a first threshold; and
a first dynamic clock and voltage scaling (DCVS) management controller configured to reduce at least one of a clock frequency and a voltage supplied to the first processing subsystem if the first idle frequency is not less than the first threshold.

9. The system of clause 8, wherein:
the first idle monitor system comprises a plurality of idle monitors, each idle monitor associated with one of a plurality of processing cores of the first subsystem;
the first limits management controller is configured to determine an idle status of each of the plurality of processing cores of the first subsystem using the information provided by the plurality of idle monitors; and
the first limits management controller is configured to determine the first idle frequency based on the idle status of each of the processing cores of the first subsystem.

10. The system of clause 9, wherein the first limits management controller is further configured to:
determine whether all processing cores of the first subsystem are simultaneously idle;
increment an idle count if all processing cores of the first subsystem are simultaneously idle;
repeat determining whether all processing cores of the first subsystem are simultaneously idle and incrementing the idle count a plurality of sampling times; and
determine the first idle frequency by determining a ratio of the idle count to the sampling times.

11. The system of clause 8, wherein the wherein the first DCVS management controller is configured to apply DCVS based on power if the first idle frequency is less than the first threshold.

12. The system of clause 8, wherein:
the first limits management controller is further configured to compare the first idle frequency with a second threshold if the idle frequency is not less than the first threshold, wherein the second threshold represents a greater idle frequency than the first threshold; and
the first DCVS management controller is configured to reduce at least one of the clock frequency and the voltage supplied to the first processing subsystem if the first idle frequency is not less than the first threshold and the first idle frequency is not less than the second threshold.

13. The system of clause 11, wherein the first DCVS management controller is configured to apply DCVS by being configured to:
determine a power measurement associated with the first processing subsystem; and
increase at least one of the clock frequency and the voltage supplied to the first processing system if the power measurement is less than a power threshold.

14. The system of clause 8, further comprising:
a second idle monitor system associated with a second processing subsystem, the second processing system coupled with the first processing system in a pipelined arrangement;
a second limits management controller associated with the second processing subsystem, the second limits management controller configured to:
determine a second idle frequency of the second processing subsystem using information provided by the second idle monitor system; and
compare the second idle frequency with a second threshold; and
a second DCVS management controller configured to reduce at least one of a clock frequency and a voltage supplied to the second processing subsystem if the second idle frequency is not less than the first threshold.

15. The system of clause 14, wherein the first processing system comprises a first integrated circuit die of a multi-die package, and the second processing system comprises a second integrated circuit die of the multi-die package.

16. The system of clause 15, wherein:
the first processing subsystem comprises a plurality of neural processing cores; and
the second processing subsystem comprises a plurality of neural processing cores.

17. A system for adaptive power control, comprising:
means for determining a first idle frequency of a first processing subsystem comprising one or more processing cores;
means for comparing the first idle frequency with a first threshold; and
means for reducing at least one of a clock frequency and a voltage supplied to the first processing subsystem if the first idle frequency is not less than the first threshold.

18. The system of clause 17, wherein the means for determining the first idle frequency comprises:
means for determining an idle status of each of a plurality of processing cores of the first subsystem; and
means for determining the first idle frequency based on the idle status of each of the processing cores.

19. The system of clause 18, wherein the means for determining the first idle frequency further comprises:
means for determining whether all processing cores of the first subsystem are simultaneously idle;
means for incrementing an idle count if all processing cores of the first subsystem are simultaneously idle; and
means for repeating the determining of whether all processing cores of the first subsystem are simultaneously idle and the incrementing of the idle count a plurality of sampling times;
wherein the means for determining the idle frequency comprises means for determining a ratio of the idle count to the sampling times.

20. The system of clause 17, further comprising means for applying dynamic clock and voltage scaling (DCVS) based on power if the first idle frequency is less than the first threshold.

21. The system of clause 17, further comprising:
means for comparing the first idle frequency with a second threshold if the first idle frequency is not less than the first threshold, wherein the second threshold represents a greater idle frequency than the first threshold;
wherein the means for reducing at least one of the clock frequency and the voltage supplied to the first processing subsystem comprises means for reducing at least one of the clock frequency and the voltage supplied to the first processing subsystem if the first idle frequency is not less than the first threshold and the first idle frequency is not less than the second threshold.

22. The system of clause 20, wherein the means for applying DCVS comprises:
means for determining a power measurement associated with the first processing subsystem; and
means for increasing at least one of the clock frequency and the voltage supplied to the first processing system if the power measurement is less than a power threshold.

23. The system of clause 17, further comprising:
means for determining a second idle frequency of a second processing subsystem coupled in a pipelined arrangement with the first processing subsystem;
means for comparing the second idle frequency with the first threshold; and
means for reducing at least one of a clock frequency and a voltage supplied to the second processing subsystem if the second idle frequency is not less than the first threshold.

24. A system for adaptive power control in a multi-die package, comprising:
a first idle monitor system in a first die, the first idle monitor system associated with a first processing subsystem in the first die, the first processing system comprising one or more processing cores;
a first limits management controller in the first die, the first limits management controller associated with the first processing subsystem, the first limits management controller configured to:
determine a first idle frequency of the first processing subsystem using information provided by the first idle monitor system; and
compare the first idle frequency with a first threshold;
a first dynamic clock and voltage scaling (DCVS) management controller in the first die configured to reduce at least one of a clock frequency and a voltage supplied to the first processing subsystem if the first idle frequency is not less than the first threshold; and
a second idle monitor system in a second die, the second die coupled with the first die in a pipelined arrangement, the second idle monitor system associated with a second processing subsystem in the second die, the second processing system comprising one or more processing cores;
a second limits management controller in the second die, the second limits management controller associated with the second processing subsystem, the second limits management controller configured to:
determine a second idle frequency of the second processing subsystem using information provided by the second idle monitor system; and
compare the second idle frequency with the first threshold;
a second DCVS management controller in the second die configured to reduce at least one of a clock frequency and a voltage supplied to the second processing subsystem if the second idle frequency is not less than the first threshold.

25. The system of clause 24, wherein:
the first idle monitor system comprises a plurality of first idle monitors, each first idle monitor associated with one of a plurality of processing cores of the first subsystem;
the first limits management controller is configured to determine an idle status of each of the plurality of processing cores of the first subsystem using the information provided by the plurality of first idle monitors;
the first limits management controller is configured to determine the first idle frequency based on the idle status of each of the processing cores of the first processing subsystem;
the second idle monitor system comprises a plurality of second idle monitors, each second idle monitor associated with one of a plurality of processing cores of the second processing subsystem;
the second limits management controller is configured to determine an idle status of each of the plurality of processing cores of the second subsystem using the information provided by the plurality of second idle monitors; and
the second limits management controller is configured to determine the second idle frequency based on the idle status of each of the processing cores of the second processing subsystem.

26. The system of clause 25, wherein:
the first limits management controller is further configured to determine whether all processing cores of the first subsystem are simultaneously idle;
increment a first idle count if all processing cores of the first subsystem are simultaneously idle;
repeat determining whether all processing cores of the first subsystem are simultaneously idle and incrementing the first idle count a plurality of sampling times; and
determine the first idle frequency by determining a ratio of the idle count to the sampling times; and
the second limits management controller is further configured to:
determine whether all processing cores of the second subsystem are simultaneously idle;
increment a second idle count if all processing cores of the second subsystem are simultaneously idle;
repeat determining whether all processing cores of the second subsystem are simultaneously idle and incrementing the second idle count a plurality of sampling times; and
determine the second idle frequency by determining a ratio of the second idle count to the sampling times.

27. The system of clause 24, wherein:
the first DCVS management controller is configured to apply DCVS based on power if the first idle frequency is less than the first threshold; and
the second DCVS management controller is configured to apply the DCVS based on power if the second idle frequency is less than the first threshold.

28. The system of clause 24, wherein:
the first limits management controller is further configured to compare the first idle frequency with a second threshold if the first idle frequency is not less than the first threshold, wherein the second threshold represents a greater idle frequency than the first threshold;

the first DCVS management controller is configured to reduce at least one of the clock frequency and the voltage supplied to the first processing subsystem if the first idle frequency is not less than the first threshold and the first idle frequency is not less than the second threshold;

the second limits management controller is further configured to compare the second idle frequency with the second threshold if the second idle frequency is not less than the first threshold; and the second DCVS management controller is configured to reduce at least one of the clock frequency and the voltage supplied to the second processing subsystem if the second idle frequency is not less than the first threshold and the second idle frequency is not less than the second threshold.

29. The system of clause 27, wherein:

the first DCVS management controller is configured to apply DCVS by being configured to determine a first power measurement associated with the first processing subsystem and increase at least one of the clock frequency and the voltage supplied to the first processing system if the first power measurement is less than a power threshold; and the second DCVS management controller is configured to apply DCVS by being configured to determine a second power measurement associated with the second processing subsystem and increase at least one of the clock frequency and the voltage supplied to the second processing system if the second power measurement is less than the power threshold.

30. The system of clause 24, wherein:

the first processing subsystem comprises a plurality of neural processing cores; and the second processing subsystem comprises a plurality of neural processing cores.

What is claimed is:

1. A method for adaptive power control, comprising:
   determining a first idle frequency of a first processing subsystem comprising one or more processing cores;
   comparing the first idle frequency with a first threshold; and
   reducing at least one of a clock frequency and a voltage supplied to the first processing subsystem if the first idle frequency is not less than the first threshold.

2. The method of claim 1, wherein determining the first idle frequency comprises:
   determining an idle status of each of a plurality of processing cores of the first subsystem; and
   determining the first idle frequency based on the idle status of each of the processing cores.

3. The method of claim 2, wherein determining the first idle frequency further comprises:
   determining whether all processing cores of the first subsystem are simultaneously idle;
   incrementing an idle count if all processing cores of the first subsystem are simultaneously idle; and
   repeating the determining of whether all processing cores of the first subsystem are simultaneously idle and the incrementing of the idle count a plurality of sampling times;
   wherein determining the first idle frequency comprises determining a ratio of the idle count to the sampling times.

4. The method of claim 1, further comprising applying dynamic clock and voltage scaling (DCVS) based on power if the first idle frequency is less than the first threshold.

5. The method of claim 1, further comprising:
   comparing the first idle frequency with a second threshold if the first idle frequency is not less than the first threshold, wherein the second threshold represents a greater idle frequency than the first threshold;
   wherein reducing at least one of the clock frequency and the voltage supplied to the first processing subsystem comprises reducing at least one of the clock frequency and the voltage supplied to the first processing subsystem if the first idle frequency is not less than the first threshold and the first idle frequency is not less than the second threshold.

6. The method of claim 4, wherein applying DCVS comprises:
   determining a power measurement associated with the first processing subsystem; and
   increasing at least one of the clock frequency and the voltage supplied to the first processing system if the power measurement is less than a power threshold.

7. The method of claim 1, further comprising:
   determining a second idle frequency of a second processing subsystem coupled in a pipelined arrangement with the first processing subsystem;
   comparing the second idle frequency with the first threshold; and
   reducing at least one of a clock frequency and a voltage supplied to the second processing subsystem if the second idle frequency is not less than the first threshold.

8. A system for adaptive power control, comprising:
   a first idle monitor system associated with a first processing subsystem comprising one or more processing cores;
   a first limits management controller associated with the first processing subsystem, the first limits management controller configured to:
      determine a first idle frequency of the first processing subsystem using information provided by the first idle monitor system; and
      compare the first idle frequency with a first threshold; and
   a first dynamic clock and voltage scaling (DCVS) management controller configured to reduce at least one of a clock frequency and a voltage supplied to the first processing subsystem if the first idle frequency is not less than the first threshold.

9. The system of claim 8, wherein:
   the first idle monitor system comprises a plurality of idle monitors, each idle monitor associated with one of a plurality of processing cores of the first subsystem;
   the first limits management controller is configured to determine an idle status of each of the plurality of processing cores of the first subsystem using the information provided by the plurality of idle monitors; and
   the first limits management controller is configured to determine the first idle frequency based on the idle status of each of the processing cores of the first subsystem.

10. The system of claim 9, wherein the first limits management controller is further configured to:
   determine whether all processing cores of the first subsystem are simultaneously idle;
   increment an idle count if all processing cores of the first subsystem are simultaneously idle;
   repeat determining whether all processing cores of the first subsystem are simultaneously idle and incrementing the idle count a plurality of sampling times; and determine the first idle frequency by determining a ratio of the idle count to the sampling times.

11. The system of claim 8, wherein the wherein the first DCVS management controller is configured to apply DCVS based on power if the first idle frequency is less than the first threshold.

12. The system of claim 8, wherein:
the first limits management controller is further configured to compare the first idle frequency with a second threshold if the idle frequency is not less than the first threshold, wherein the second threshold represents a greater idle frequency than the first threshold; and
the first DCVS management controller is configured to reduce at least one of the clock frequency and the voltage supplied to the first processing subsystem if the first idle frequency is not less than the first threshold and the first idle frequency is not less than the second threshold.

13. The system of claim 11, wherein the first DCVS management controller is configured to apply DCVS by being configured to:
determine a power measurement associated with the first processing subsystem; and
increase at least one of the clock frequency and the voltage supplied to the first processing system if the power measurement is less than a power threshold.

14. The system of claim 8, further comprising:
a second idle monitor system associated with a second processing subsystem, the second processing system coupled with the first processing system in a pipelined arrangement;
a second limits management controller associated with the second processing subsystem, the second limits management controller configured to:
determine a second idle frequency of the second processing subsystem using information provided by the second idle monitor system; and
compare the second idle frequency with a second threshold; and
a second DCVS management controller configured to reduce at least one of a clock frequency and a voltage supplied to the second processing subsystem if the second idle frequency is not less than the first threshold.

15. The system of claim 14, wherein the first processing system comprises a first integrated circuit die of a multi-die package, and the second processing system comprises a second integrated circuit die of the multi-die package.

16. The system of claim 15, wherein:
the first processing subsystem comprises a plurality of neural processing cores; and
the second processing subsystem comprises a plurality of neural processing cores.

17. A system for adaptive power control, comprising:
means for determining a first idle frequency of a first processing subsystem comprising one or more processing cores;
means for comparing the first idle frequency with a first threshold; and
means for reducing at least one of a clock frequency and a voltage supplied to the first processing subsystem if the first idle frequency is not less than the first threshold.

18. The system of claim 17, wherein the means for determining the first idle frequency comprises:
means for determining an idle status of each of a plurality of processing cores of the first subsystem; and
means for determining the first idle frequency based on the idle status of each of the processing cores.

19. The system of claim 18, wherein the means for determining the first idle frequency further comprises:
means for determining whether all processing cores of the first subsystem are simultaneously idle;
means for incrementing an idle count if all processing cores of the first subsystem are simultaneously idle; and
means for repeating the determining of whether all processing cores of the first subsystem are simultaneously idle and the incrementing of the idle count a plurality of sampling times;
wherein the means for determining the idle frequency comprises means for determining a ratio of the idle count to the sampling times.

20. The system of claim 17, further comprising means for applying dynamic clock and voltage scaling (DCVS) based on power if the first idle frequency is less than the first threshold.

21. The system of claim 17, further comprising:
means for comparing the first idle frequency with a second threshold if the first idle frequency is not less than the first threshold, wherein the second threshold represents a greater idle frequency than the first threshold;
wherein the means for reducing at least one of the clock frequency and the voltage supplied to the first processing subsystem comprises means for reducing at least one of the clock frequency and the voltage supplied to the first processing subsystem if the first idle frequency is not less than the first threshold and the first idle frequency is not less than the second threshold.

22. The system of claim 20, wherein the means for applying DCVS comprises:
means for determining a power measurement associated with the first processing subsystem; and
means for increasing at least one of the clock frequency and the voltage supplied to the first processing system if the power measurement is less than a power threshold.

23. The system of claim 17, further comprising:
means for determining a second idle frequency of a second processing subsystem coupled in a pipelined arrangement with the first processing subsystem;
means for comparing the second idle frequency with the first threshold; and
means for reducing at least one of a clock frequency and a voltage supplied to the second processing subsystem if the second idle frequency is not less than the first threshold.

24. A system for adaptive power control in a multi-die package, comprising:
a first idle monitor system in a first die, the first idle monitor system associated with a first processing subsystem in the first die, the first processing system comprising one or more processing cores;
a first limits management controller in the first die, the first limits management controller associated with the first processing subsystem, the first limits management controller configured to:
determine a first idle frequency of the first processing subsystem using information provided by the first idle monitor system; and
compare the first idle frequency with a first threshold;
a first dynamic clock and voltage scaling (DCVS) management controller in the first die configured to reduce at least one of a clock frequency and a voltage supplied to the first processing subsystem if the first idle frequency is not less than the first threshold; and a second idle monitor system in a second die, the second die coupled with the first die in a pipelined arrangement, the second idle monitor system associated with a second processing subsystem in the second die, the second processing system comprising one or more processing cores;

a second limits management controller in the second die, the second limits management controller associated with the second processing subsystem, the second limits management controller configured to:
    determine a second idle frequency of the second processing subsystem using information provided by the second idle monitor system; and
    compare the second idle frequency with the first threshold;

a second DCVS management controller in the second die configured to reduce at least one of a clock frequency and a voltage supplied to the second processing subsystem if the second idle frequency is not less than the first threshold.

25. The system of claim 24, wherein:
the first idle monitor system comprises a plurality of first idle monitors, each first idle monitor associated with one of a plurality of processing cores of the first subsystem;
the first limits management controller is configured to determine an idle status of each of the plurality of processing cores of the first subsystem using the information provided by the plurality of first idle monitors;
the first limits management controller is configured to determine the first idle frequency based on the idle status of each of the processing cores of the first processing subsystem;
the second idle monitor system comprises a plurality of second idle monitors, each second idle monitor associated with one of a plurality of processing cores of the second processing subsystem;
the second limits management controller is configured to determine an idle status of each of the plurality of processing cores of the second subsystem using the information provided by the plurality of second idle monitors; and
the second limits management controller is configured to determine the second idle frequency based on the idle status of each of the processing cores of the second processing subsystem.

26. The system of claim 25, wherein:
the first limits management controller is further configured to:
    determine whether all processing cores of the first subsystem are simultaneously idle;
    increment a first idle count if all processing cores of the first subsystem are simultaneously idle;
    repeat determining whether all processing cores of the first subsystem are simultaneously idle and incrementing the first idle count a plurality of sampling times; and
    determine the first idle frequency by determining a ratio of the idle count to the sampling times; and the second limits management controller is further configured to:
    determine whether all processing cores of the second subsystem are simultaneously idle;
    increment a second idle count if all processing cores of the second subsystem are simultaneously idle;
    repeat determining whether all processing cores of the second subsystem are simultaneously idle and incrementing the second idle count a plurality of sampling times; and
    determine the second idle frequency by determining a ratio of the second idle count to the sampling times.

27. The system of claim 24, wherein:
the first DCVS management controller is configured to apply DCVS based on power if the first idle frequency is less than the first threshold; and
the second DCVS management controller is configured to apply the DCVS based on power if the second idle frequency is less than the first threshold.

28. The system of claim 24, wherein:
the first limits management controller is further configured to compare the first idle frequency with a second threshold if the first idle frequency is not less than the first threshold, wherein the second threshold represents a greater idle frequency than the first threshold;
the first DCVS management controller is configured to reduce at least one of the clock frequency and the voltage supplied to the first processing subsystem if the first idle frequency is not less than the first threshold and the first idle frequency is not less than the second threshold;
the second limits management controller is further configured to compare the second idle frequency with the second threshold if the second idle frequency is not less than the first threshold; and
the second DCVS management controller is configured to reduce at least one of the clock frequency and the voltage supplied to the second processing subsystem if the second idle frequency is not less than the first threshold and the second idle frequency is not less than the second threshold.

29. The system of claim 27, wherein:
the first DCVS management controller is configured to apply DCVS by being configured to determine a first power measurement associated with the first processing subsystem and increase at least one of the clock frequency and the voltage supplied to the first processing system if the first power measurement is less than a power threshold; and
the second DCVS management controller is configured to apply DCVS by being configured to determine a second power measurement associated with the second processing subsystem and increase at least one of the clock frequency and the voltage supplied to the second processing system if the second power measurement is less than the power threshold.

30. The system of claim 24, wherein:
the first processing subsystem comprises a plurality of neural processing cores; and
the second processing subsystem comprises a plurality of neural processing cores.

* * * * *